United States Patent [19]
Park

[11] Patent Number: 6,043,892
[45] Date of Patent: *Mar. 28, 2000

[54] EXPOSURE FIELD SENSOR OF A CHIP LEVELING APPARATUS HAVING AN APERTURE FOR CHANGING AT LEAST ONE DIMENSION OF THE INCIDENT LIGHT OF THE SENSOR

[75] Inventor: Soon-jong Park, Kyungki-do, Rep. of Korea

[73] Assignee: Samsung Electronics Co., Ltd., Suwon, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 09/167,668

[22] Filed: Oct. 7, 1998

[30] Foreign Application Priority Data

Dec. 5, 1997 [KR] Rep. of Korea ............... 97-66286

[51] Int. Cl.⁷ .................................................. G01B 11/00
[52] U.S. Cl. .................. 356/400; 250/548; 250/559.3
[58] Field of Search ................ 356/237.1–237.6, 356/375, 399–401, 371, 394, 376, 398; 250/548, 559.3; 355/71, 53, 55, 67

[56] References Cited

U.S. PATENT DOCUMENTS

| | | |
|---|---|---|
| 4,902,900 | 2/1990 | Kamiya et al. . |
| 5,218,415 | 6/1993 | Kawashima . |
| 5,374,398 | 12/1994 | Isami et al. . |
| 5,473,166 | 12/1995 | Imai et al. . |
| 5,894,341 | 4/1999 | Nishi et al. . |

*Primary Examiner*—K. P. Hantis
*Attorney, Agent, or Firm*—Jones Volentine, L.L.P.

[57] ABSTRACT

A chip leveling apparatus of wafer exposure equipment adjusts the diameter of the light incident on a wafer according to the chip size so that the inclination of that area can be accurately detected for use in leveling the wafer in preparation for exposure. A wafer leveling stage supports the wafer during its exposure. A stage driving mechanism can adjust the inclination of the wafer leveling stage relative to the horizontal. A light source produces a collimated beam of light which is directed towards the wafer exposure field at an acute angle. A location sensor is fixed in position to receive the light once the light has reflected from the exposure field, and thereby senses the inclination of the exposure field. A computer controller receives information from the sensor and controls the stage driving mechanism accordingly. To ensure that the information generated by the location sensor is an accurate representation of the inclination of the exposure field, an iris having an aperture matched to the exposure field is provided in the path of the light before it meets the wafer, whereby the spot of light incident on the wafer coincides best with the exposure field.

26 Claims, 9 Drawing Sheets

EXPOSURE FIELD SENSOR OF A CHIP LEVELING APPARATUS HAVING AN APERTURE FOR CHANGING AT LEAST ONE DIMENSION OF THE INCIDENT LIGHT OF THE SENSOR

BACKGROUND OF THE INVENTION

1. Field of the Invention

The present invention relates to a chip leveling apparatus of semiconductor wafer exposure equipment. More particularly, the present invention relates to the exposure field sensor of the chip leveling apparatus which senses the average inclination of an exposure field of the wafer and generates signals which are used by the apparatus to ensure that the exposure field is perpendicular to the optical axis of a reduction projection lens of the exposure equipment.

2. Description of the Related Art

The accurate and fine formation of electrical circuit patterns is critical in the production of highly-integrated semiconductor devices.

Such patterns are typically formed on semiconductor wafers by a stepper. The stepper has a reduction projection lens by which a specific pattern of a reticle is optically reduced and transferred onto the wafer by exposing the wafer to light passing through the reticle. In this process, the wafer surface must lie perpendicular to the optical axis of the reduction projection lens if the pattern of the reticle is to be precisely reproduced on the surface of the wafer.

The exposure process is thus gaining more scrutiny in the attempt to meet the demand for more highly-integrated semiconductor devices.

As the result of such scrutiny, it has been noted that sometimes the optical axis of the reduction projection lens is thrown out of alignment during the maintenance or repair of the equipment, or during the exposure process. Furthermore, the degree to which the surface of the wafer is level varies amongst the different portions of the surface. Therefore, certain portions of the wafer surface do not lie perpendicular to the optical axis. In other words, the exposure field is not always perpendicular to the optical axis of the reduction projection lens.

To address this problem, the stepper has a chip leveling apparatus. The apparatus performs a chip leveling operation prior to the execution of the exposure process. "Chip leveling" refers to the operation of orienting the chip surface of the wafer so that it is perpendicular to the optical axis of the reduction projection lens.

Figure 1:
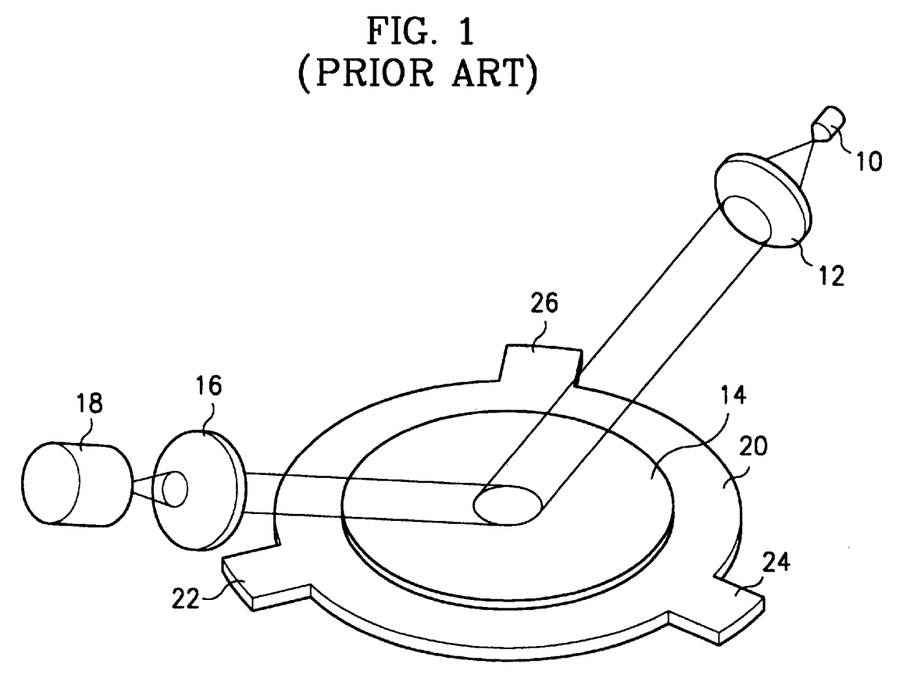
FIG. 1 is a perspective view of a conventional chip leveling apparatus of wafer exposure equipment.

The conventional chip leveling apparatus, as illustrated in FIG. 1, comprises a leveling sensor assembly and a wafer leveling stage. The leveling sensor assembly optically examines the exposure field of the wafer and determines the average inclination of that area of the wafer.

More specifically, light emitted by a light emitting diode 10 is collimated by a collimator lens 12, and is incident on the wafer 14. The center of the beam coincides with the center of the exposure field, and the beam reflected from the wafer surface 14 passes through a collecting lens 16. The collecting lens 16 focuses the beam onto a location detector 18. The location detector 18 is typically a light sensor having four quadrants delineated by cross hairs. The circular face of the beam of reflected light is separated into four sections by the cross hairs.

Figure 2:
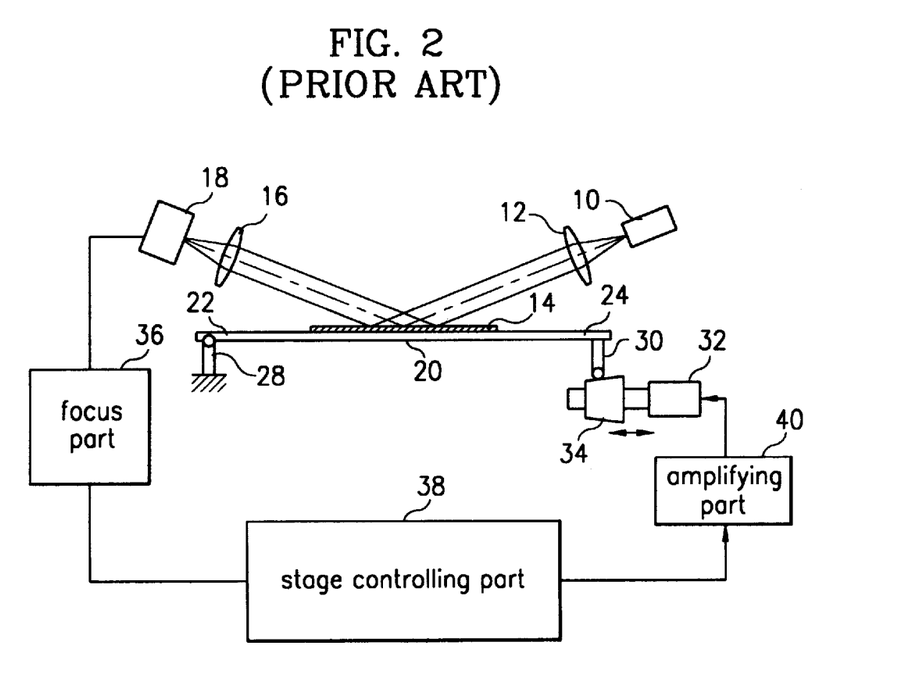
FIG. 2 is a schematic diagram of the conventional chip leveling apparatus.

The wafer leveling stage 20 is adjusted, based on the results of the detection, by the system illustrated in FIG. 2. The wafer leveling stage 20 has one fixed mount 22 and two movable mounts 24, 26. The fixed mount 22 is supported by a support column 28. Other support columns 30 are disposed below the movable mounts 24, 26, respectively. Each support column 30 is in turn supported by a conical cam 34. A stepper motor 32 is coupled with each cam 34 so as to reciprocate the cam 34 linearly in a horizontal direction.

An electrical signal, indicative of the amounts of light received in each quadrant of the light sensor, is generated by the location detector 18. This signal is issued to a focus part 36 of a controller. The focus part 36 converts the electrical signal into a signal representative of the direction in which the wafer leveling stage 20 must be inclined to level the exposure field of the wafer, and transfers the signal to a stage controlling part 38. The signal input to the stage controlling part 38 is converted into a motor-driving signal which is amplified by an amplifier 40 of the controller and issued to the stepper motors 32. Accordingly, the stepper motors 32 are driven as the situation requires. When a stepper motor 32 is driven, the cam 34 coupled thereto is moved axially. Consequently, the movable mount supported on the cam 34 via the support column 30 moves vertically.

The inclination of the wafer leveling stage 20 is dependent on the positions of the mounts 24, 26. The wafer leveling stage 20 is tilted until the exposure field of the wafer is perpendicular to the optical axis of the reduction projection lens.

Figure 3A:
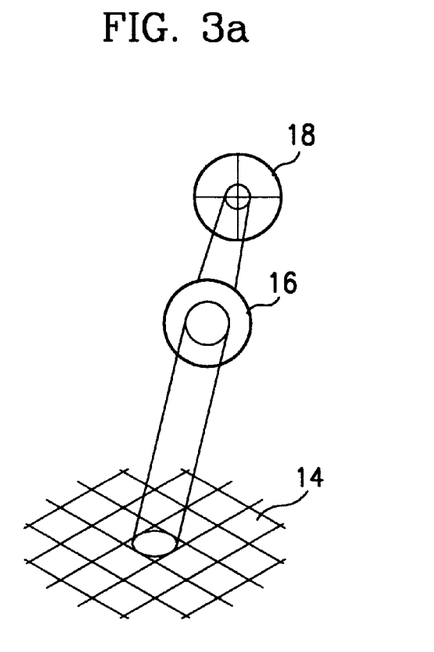
FIG. 3a is a schematic diagram of a sensor of the conventional chip leveling apparatus showing a reflected beam focused on the sensor once the exposure field of the wafer is level.
Figure 3B:
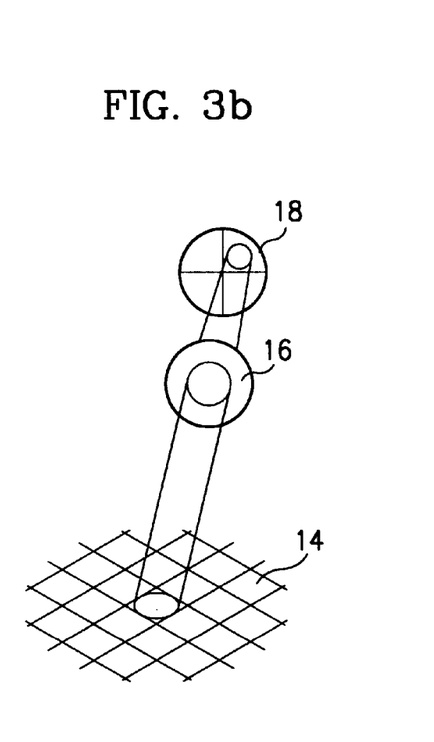
FIG. 3b is a similar diagram but showing the reflected beam when the exposure field is not level.

FIG. 3b shows the light beam incident on a certain quadrant of the light sensor before the position of the wafer leveling stage 20 has been adjusted. When the chip leveling operation is completed, the light beam reflected from the wafer 14 will be focused on the center of the light sensor as shown in FIG. 3a.

Accordingly, an accurate detection of the spot of light by the light sensor is very important to the wafer chip leveling operation.

The beam of light generated in the conventional wafer chip leveling apparatus has a fixed diameter. However, the chip leveling operation is carried out for chips having various sizes. Therefore, the conventional chip leveling apparatus can only perform correctly for chips of certain sizes.

Figure 3C:
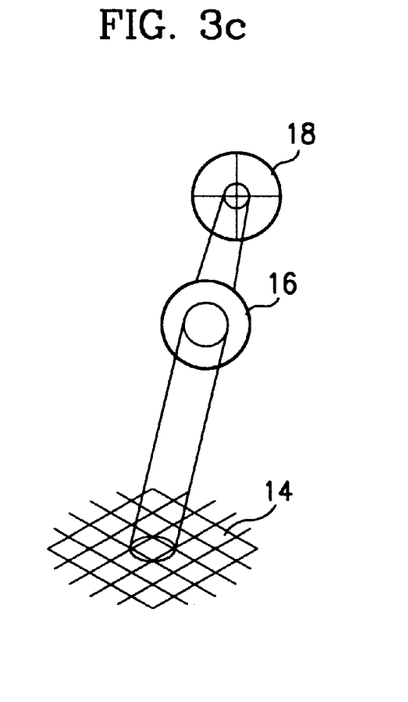
FIG. 3c is another similar diagram but showing a case in which the beam has a diameter larger than that of the exposure field.

That is, when the diameter of the incident beam is larger than the exposure field as shown in FIG. 3c, the beam is reflected off of an area larger than the actual area set for exposure. The average inclination of the area scanned by the beam can differ from the average inclination of the exposure field. Thus, the chip leveling operation can be carried out inaccurately.

Figure 3D:
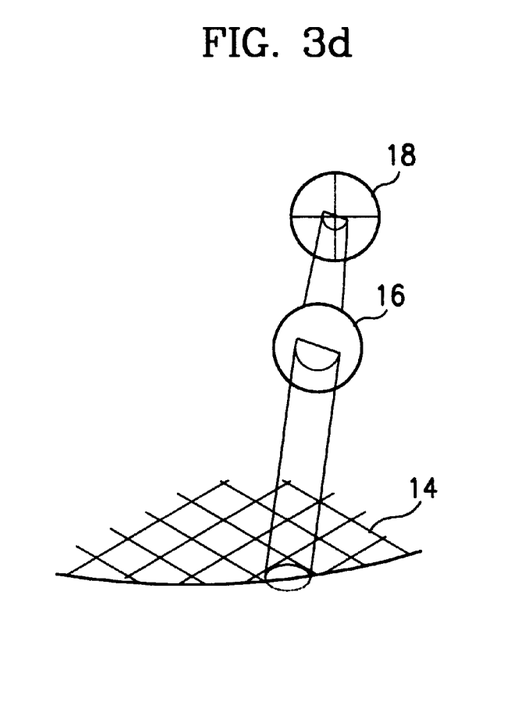
FIG. 3d is another similar diagram but showing the beam reflected from an exposure field at the periphery of the wafer.

FIG. 3d shows the case of leveling a chip located at the periphery of the wafer. In this case, the beam reflected from the exposure field is truncated. As a result, the location detector 18 often creates a processing error that causes the chip leveling apparatus to malfunction.

SUMMARY OF THE INVENTION

An object of the present invention is to substantially overcome one or more of the problems, limitation and disadvantages of the related art by providing a chip leveling apparatus which can change the width of the beam incident on the surface of the wafer so as to be better matched to the size of the exposure field.

To this end, the present invention provides a chip leveling apparatus of wafer exposure equipment which includes an iris having a window at its center, the diameter of the window being smaller than that of the collimated beam of light which is directed toward the surface of the wafer, and a driving mechanism for moving the iris into and out of the path of the collimated beam of light.

The iris is a transparent plate having a coating of opaque material except at its center (aperture), or a round plate of transparent material (aperture) surrounded by a plate of opaque material.

The driving mechanism can be either a cylinder or a reversible motor. The iris is supported by an iris support member integral with an end of a piston rod of the cylinder or coupled to the output shaft of the reversible motor. The iris support member has a concavity in which the iris is seated.

In addition, the chip leveling apparatus has a proximity sensor for sensing whether the iris is disposed in the path of the collimated beam of light, a control circuit which issues a signal responsible for setting the iris in position, and an error detecting circuit operatively connected to the proximity sensor and to the control circuit for determining whether an error has occurred in the positioning of the iris in the path of the collimated beam of light. An alarm is triggered by the error detecting circuit when an error in the positioning of the iris has been detected.

The object of the present invention is also achieved by the provision of a chip leveling apparatus of wafer exposure equipment which includes an iris having an aperture whose size is variable such that the diameter of the collimated beam of light can be changed by the iris before the light impinges the surface of the wafer.

The iris may be adjusted manually or automatically to set the size of the aperture.

The iris comprises a fixed member, an adjustable member, and a plurality of elements which together define the size of said aperture. These elements are coupled to the adjustable member in such a way that the size of the aperture changes as the adjustable member is moved relative to said fixed member. Preferably, the adjustable member is a rotary member.

The fixed member has an outer surface on which a reference mark is formed. The rotary member, on the other hand, has a series of sizes marked thereon as spaced from one another in the circumferential direction of the rotary member. Each of these size markings can be aligned with the reference mark so as to indicate the size of the aperture being formed by the iris.

An-auto-focus mechanism may be employed to automatically adjust the iris so that the aperture thereof will allow the beam of light passing therethrough to have a cross-sectional area best matched to the actual area of the exposure field.

To expand the range of chip sizes for which the present invention may be used, the present invention can employ a set of irises having apertures of different sizes. The iris supporting member can support any one of the irises, which are selected for use based on the chip sizes of the wafer.

BRIEF DESCRIPTION OF THE DRAWINGS

These and other objects, features and advantages of the present invention will become clear from the following detailed description of preferred embodiments thereof made with reference to the accompanying drawings, of which.

DETAILED DESCRIPTION OF THE PREFERRED EMBODIMENTS

The present invention now will be described more fully hereinafter with reference to the accompanying drawings, in which preferred embodiments of the invention are shown. Like numbers refer to like elements throughout the drawings.

Figure 4A:
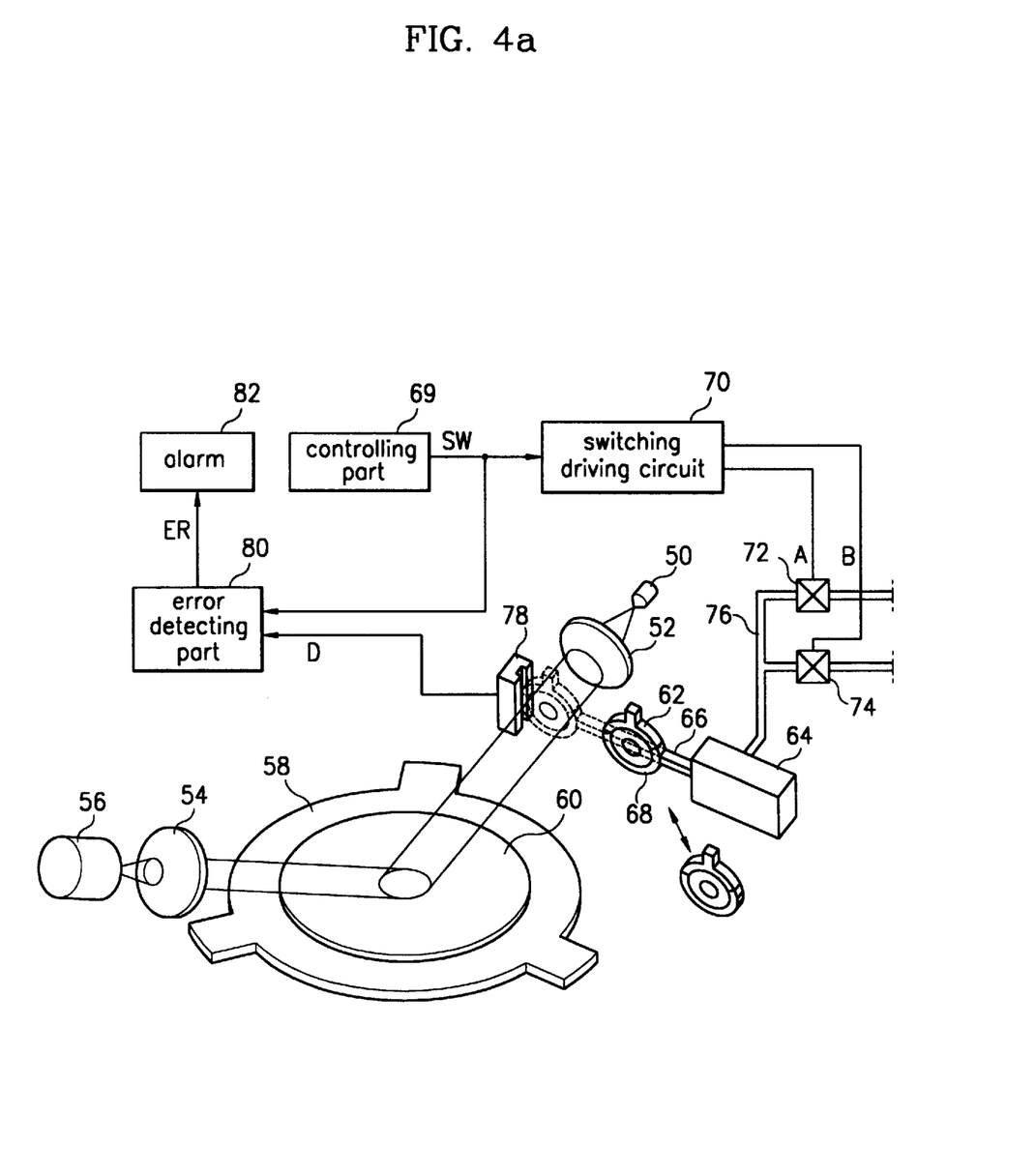
FIG. 4a is a schematic diagram of one embodiment of a chip leveling apparatus of wafer exposure equipment according to the present invention.

First, referring to FIG. 4a, like the conventional chip leveling apparatus, the chip leveling apparatus of the present invention comprises a light emitting diode 50, a collimator lens 52, a collecting lens 54, a location detector 56, and a wafer leveling stage 58. A wafer 60 is mounted on the wafer leveling stage 58 below the other elements mentioned above.

The light emitted from the light emitting diode 50 is collimated by the collimator lens 52, and is incident on the wafer 60. The collecting lens 54 and the location detector 56 are disposed in the path of the beam of light reflected from the surface of the wafer 60. Thus, the reflected beam of light is focused by the collecting lens 54 onto the location detector 56.

An iris 62 is located between the collimator lens 52 and the wafer 60. The iris 62 is mounted to a semi-annular iris support member 68 by being seated in a groove (upwardly open concavity) formed in the iris support member 68. The iris support member 68 is integral with an end of a piston rod 66 of an air cylinder 64. The piston rod 66 of the air cylinder 64 can reciprocate the iris 62 along a straight line between a first location at which the iris 62 is out of the optical path of the collimated beam and a second location at which the beam will be intercepted by the iris 62.

The air cylinder 64 is driven when a switching signal (SW) is issued by a controlling part 69 to a switching driving circuit 70. When the switching signal (SW) is received by the switching driving circuit 70, the switching driving circuit 70 issues either a high or low level control signal (A,B) to valves 72, 74. The valves 72, 74 are provided in piping 76 of a pneumatic circuit including a source of air. The level of the control signal (A,B) applied to the valves 72, 74 determines whether the valves 72, 74 will open or close and hence, whether the chambers of the air cylinder 64 are subjected to positive or negative pressure via the piping 76. That is, the opening and closing of the valves 72, 74 drives the piston rod 66 of the air cylinder 64 to move the iris 62 to the first location or the second location.

A sensor assembly 78 senses when the iris 62 is disposed at the second location. An error detecting part 80 receives a sensing signal (D) from the sensor assembly 78 indicating whether the iris 62 is disposed at the second location, and a switching signal (SW) from the controlling part 69. The sensor assembly 78 is a proximity detector and may comprise a light emitting part and a light receiving part spaced apart from one another. When the iris is disposed between the light emitting part and a light receiving part, the light receiving part receives no light from the light emitting part, i.e. the sensor assembly optically senses the end of the iris.

If the switching signal (SW) is of the type by which the switching driving circuit 70 should have controlled the air cylinder 64 to have moved the iris 62 to the second location, and the sensing signal (D) indicates that the iris 62 is not in fact disposed at the second location, the error judging part 80 issues an error signal (ER) to an alarm 82, thereby triggering the alarm 82.

Figure 5:
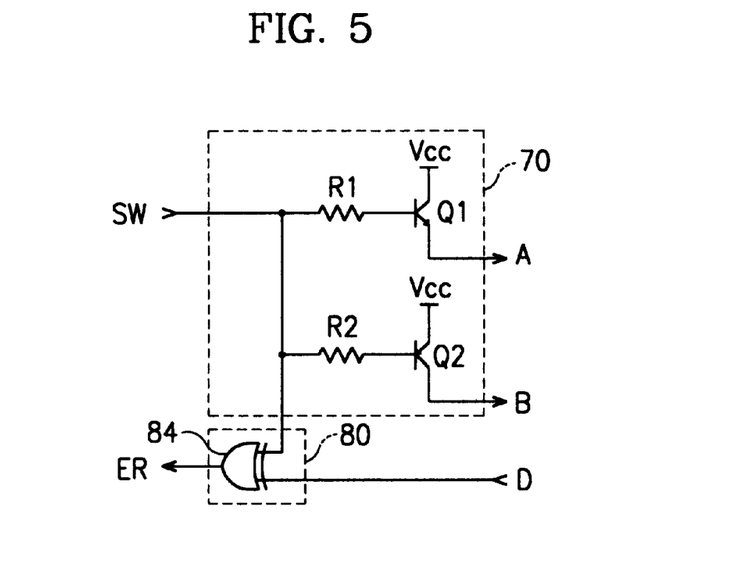
FIG. 5 is a circuit diagram of the switching driving circuit and error detecting part of the controller of the first embodiment of the chip leveling apparatus according to the present invention.

Referring to FIG. 5 showing the switching driving circuit 70, the switching signal (SW) is applied to the bases of parallel transistors Q1, Q2 through resistors R1, R2, respectively. The transistors Q1, Q2 are NPN and PNP types of resistors, respectively. A constant voltage (Vcc) is applied to a collector of the transistor Q1, and to an emitter of the transistor Q2, and depending on the switching signal, a high/low level control signal issues from the emitter to the corresponding air valve 72, 74.

The error detecting part 80 is formed of an exclusive logic-sum gate 84. If the proper switching signal (SW) and the sensing signal (D) are input to the exclusive logic-sum gate 84, they are summed and the error signal (ER) is consequently issued to the alarm 82.

Now, the operation of the first embodiment of the present invention will be described in more detail.

The present invention allows an operator to change the diameter of the beam incident on the exposure field of the wafer by allowing the iris 62 to be moved into the path of the beam emitted by the light-emitting diode 50 and collimated by the collimator lens 52. To do this, the operator must move the iris support member 68 from the first location to the second location.

With regard to this operation, when a high level switching signal (SW) is applied to the switching driving circuit 70, the state of the transistors (Q1, Q2) is changed so that a high level signal is applied to the air valve 72, and a low level of signal is applied to the air valve 74. This in turn changes the state (opened or closed) of each of the valves 72, 74. As a result, air is supplied to the air cylinder 64 through piping 76 and accordingly, the rod 66 is extended so that the iris 62 at the end of the rod 66 is moved to the second location.

Once the iris 62 is disposed at the second location, the diameter of the collimated beam of light propagating towards the exposure field of the wafer 60 from the lens 52 is changed by the aperture of the iris 62.

The iris 62 is used so that the chip leveling apparatus can irradiate an exposure field of a wafer with a light beam having a diameter smaller than that which proceeds directly to the exposure field from the collimator lens 52. For instance, with reference to the case depicted in FIG. 3c, an iris having an aperture of a smaller diameter than that of the collimated beam of light can be used so that the light incident on the exposure field has a cross-sectional area more closely matched to the area of the exposure field. Therefore, a more accurate chip leveling operation is possible.

It should also be noted that the iris support member 68 allows the iris 62 to be replaced. Thus, when the iris is at the first location, it can be removed from the iris support member 68 and exchanged with an iris having an aperture of a different size. Such an iris is shown by dotted lines in FIG. 4a.

Figure 4B:
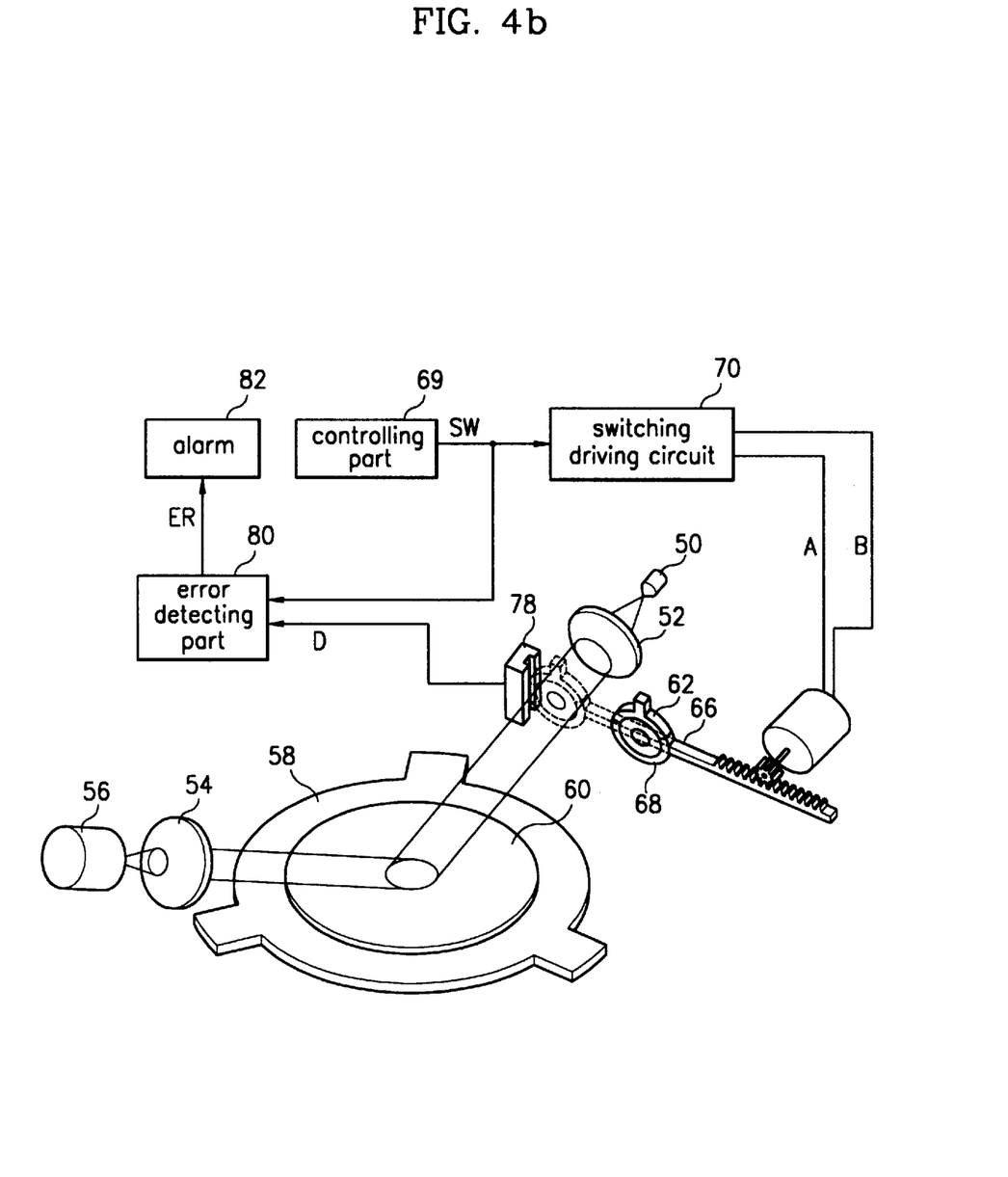
FIG. 4b is a similar view but showing another form of the iris driving mechanism.
Figure 4C:
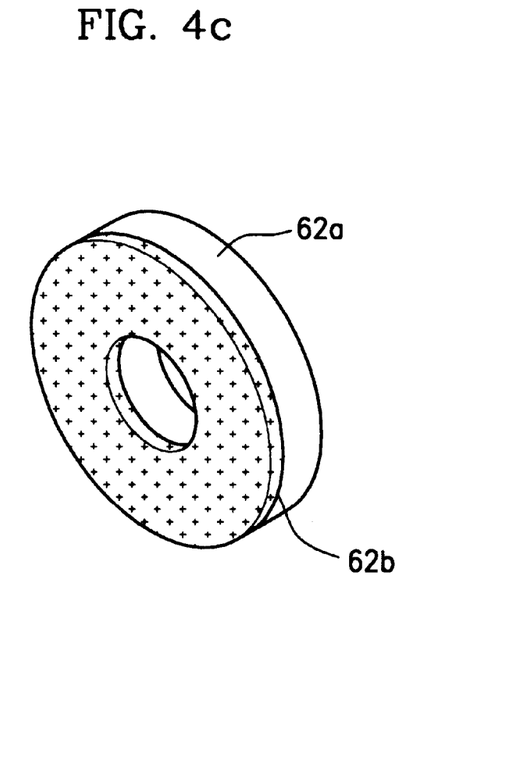
FIG. 4c is a perspective view of an iris of the first embodiment of a chip leveling apparatus of wafer exposure equipment according to the present invention.
Figure 4D:
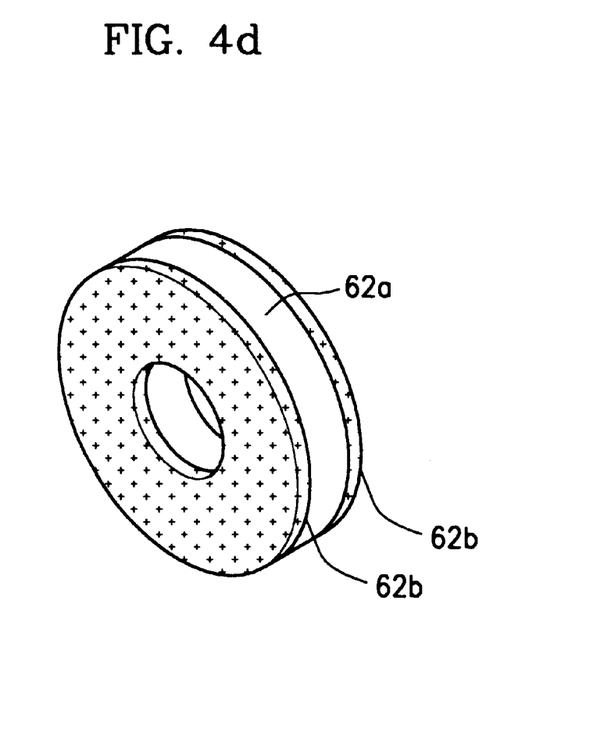
FIG. 4d is a perspective view of another iris.

Referring to FIGS. 4c and 4d, the iris 62 comprises a transparent glass plate 62a coated with opaque material 62b except at a central portion thereof constituting the aperture or pupil. The coating can be provided on both sides of the plate or on only one side thereof. The opaque material 62b is preferably chrome.

Figure 4E:
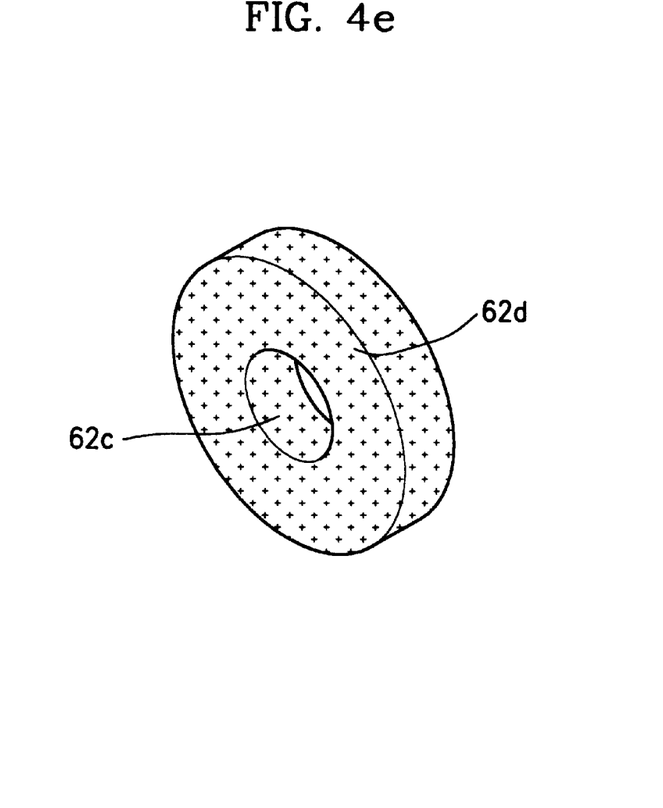
FIG. 4e is a perspective view of yet another iris.

Alternatively, as shown in FIG. 4e, the iris can comprises a round plate 62c of transparent material, constituting the aperture, surrounded by a plate 62d of opaque material.

The switching signal (SW) of the controlling part 69 assumes a low level state when the iris 62 is to be exchanged. In this case, the state (opened or closed) of the valves 72, 74 is changed, air in the air cylinder 64 is vented to a location of negative pressure, and thus, the piston rod 66 retracts to move the iris 62 to the first location.

It should also be noted that other types of driving mechanisms can be used instead of the air cylinder 64. For instance, as shown in FIG. 4b, a motor 80 can be used to move the iris supporting member 68. The output shaft 81 of such a motor can be rotated in forward and reverse, depending on the current supplied to the motor, to drive the iris supporting member 68 between the first and second locations. In this case, the motor is directly connected to the switching driving circuit 70.

Figure 6:
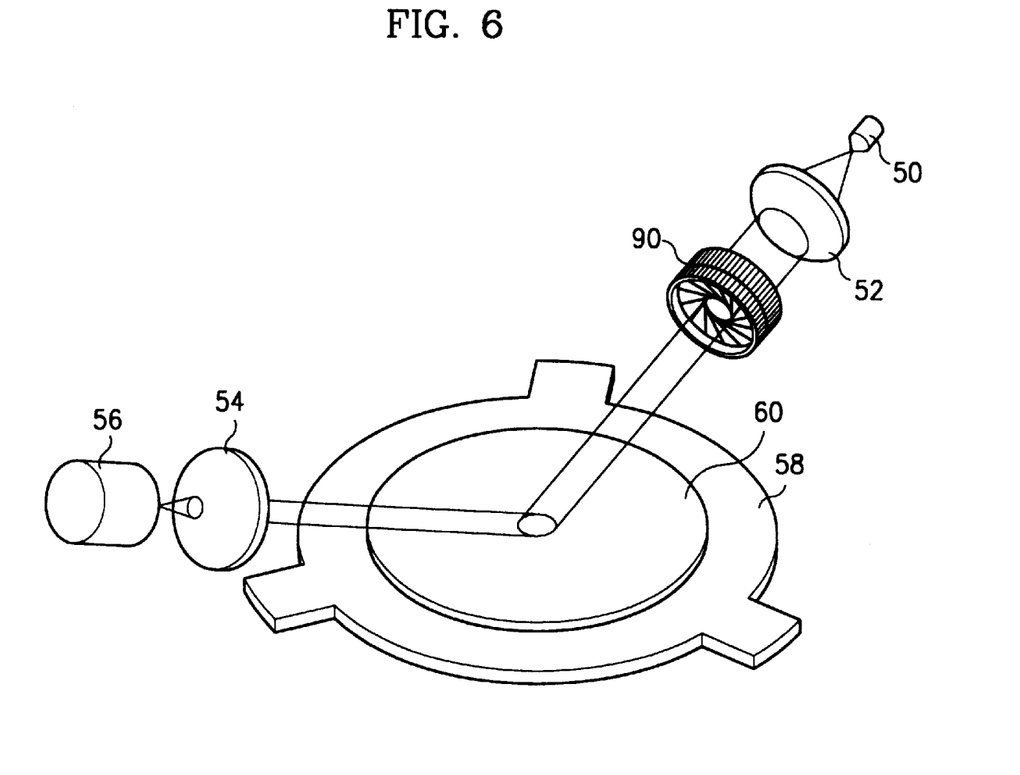
FIG. 6 is a schematic diagram of another embodiment of a chip leveling apparatus of wafer exposure apparatus according to the present invention.

FIG. 6 shows a second embodiment of the present invention in which the iris 90 has an aperture whose diameter can be manually adjusted or automatically adjusted responsive to a detection of the size of the exposure field. The iris 90 is supported by a frame in the optical path between the collimator lens 52 and the wafer. Similar to the first embodiment, this frame may be an iris support member which allows the iris 90 to be replaced with one whose aperture can assume different sizes compared to the original iris 90.

Figure 7:
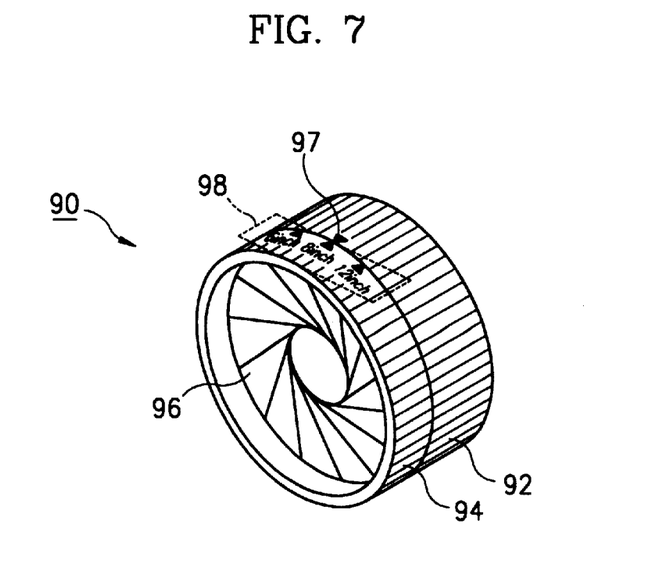
FIG. 7 is an enlarged perspective view of the iris shown in FIG. 6.

The iris 90 has a fixed member 92, a rotary member 94 coupled to the fixed member 92 so as to be rotatable relative thereto, and an iris wing member 96. Rotating the rotary member 94 causes the elements of the iris wing member 96 to fold over each other or to unfold, thereby increasing or decreasing the size of the aperture at its center.

In addition, a reference 97 and a series of sizes 98 are marked on the outer surfaces of the fixed member 92 and the rotary member 94, respectively, to allow the operator to view the size of the aperture currently being formed by the iris wing member 96.

Figure 8:
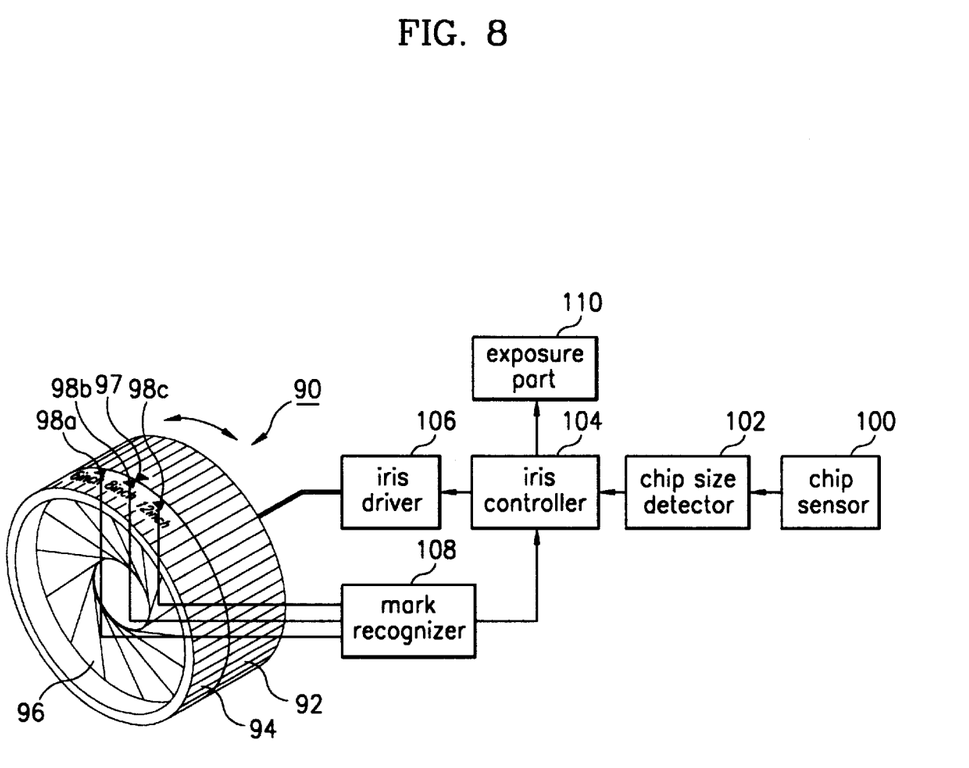
FIG. 8 is a schematic diagram of a portion of the controller of the second embodiment which is responsible for automatically controlling the iris.

FIG. 8 shows the components of the controller for automatically controlling the iris 90. In this respect, a sensor 100 for sensing the chip size is connected to an iris controller 104 through a chip size detector 102. A mark recognizer 108 for recognizing the setting (marks 98a,98b, 98c) of the iris 90 is also connected to the iris controller 104. The mark recognizer 108 comprises respective sensors associated with each of the size marks 98a, 98b, 98c, and which sensors can determine when the size mark associated therewith is aligned with the reference mark 97. The iris controller is in turn connected to an iris driver 106 and to an exposure part 110.

Once the chip size (exposure field of the wafer) is sensed by the sensor 100, a chip detection signal indicative of the chip size is issued to the iris controller 104 by the chip size detector. At the same time, the mark recognizer 108 issues an aperture signal indicative of the setting of the iris 90 to the iris controller 104. The iris controller 104 controls the iris driver 106 according to the aperture signal and the chip detection signal if the size of the aperture needs to be changed to better match the cross-sectional area of the collimated beam to the exposure field. On the other hand, the iris controller 104 outputs an exposure signal to the exposure part 110 when it is not necessary to control the iris 90. The exposure signal initiates the exposure process.

The iris controller, per se, may therefore have a structure similar to that of the auto-focusing system of a camera.

As described above, the present invention allows the size of the aperture of the iris to be changed, either manually or automatically, so that the diameter of the beam incident on the wafer is optimal for the area of the wafer which is to be exposed. Being optimal refers to the fact that the chip leveling operation is carried out based on sensed information which most accurately reflects the state of the exposure field that is being leveled.

Accordingly, the chip leveling apparatus performs well for chips of various sizes, that is, for a wafer in which the exposure fields have various widths (areas). Therefore, the chip leveling apparatus of the present invention can be used to make various chips having highly integrated circuits from a single wafer.

Although the present invention has been described in detail above, various changes, substitutions and alterations thereto will become apparent to those of ordinary skill in the art. Accordingly, all such changes, substitutions and alterations are seen to be within the true spirit and scope of the invention as defined by the appended claims.

What is claimed is:

1. An apparatus for detecting deviation of a surface from a reference plane, said apparatus comprising:
   a leveling stage for supporting a surface to be exposed;
   a plurality of support members supporting said leveling stage so as to allow the stage to be tilted relative to the horizontal;
   a stage driver, disposed at one side of said leveling stage, which tilts said leveling stage relative to the horizontal;
   a light source which outputs light directed toward the upper surface of the leveling stage at an acute angle relative to the horizontal so as to irradiate an exposure field of a surface supported on the stage;
   a detector which receives the light once the light has reflected from the exposure field and determines whether the exposure field is inclined relative to the horizontal;
   an aperture which alters at least one dimension of the beam of light from said light source before the light is incident on the detector; and
   means for moving the aperture between a first location at which the aperture is disposed out of the path of the beam of light such that no aperture is in the path of the beam of light and a second location at which the aperture is disposed in the path of the beam of light.

2. The apparatus of claim 1, wherein said aperture comprises an iris having a window at its center, the diameter of the window being smaller than that of the beam of light.

3. The apparatus of claim 2, wherein said iris comprises a transparent plate, the transparent plate having a coating of opaque material surrounding said center.

4. The apparatus of claim 3, wherein said opaque material coats both sides of the plate.

5. The apparatus of claim 3, wherein said opaque material coats only one side of the plate.

6. The apparatus of claim 3, wherein said transparent plate is of glass.

7. The apparatus of claim 6, wherein said opaque material is chrome.

8. The apparatus of claim 2, wherein said iris comprises a round plate of transparent material, and a plate of opaque material surrounding the transparent plate.

9. The apparatus of claim 1, wherein said means for moving comprises an air cylinder, said aperture being supported by an end of a piston rod of the air cylinder, and said piston rod being reciprocatable between a first position at which the aperture is disposed at said first location and a second position at which the aperture is disposed at said second location.

10. The apparatus of claim 9, further comprising an air cylinder control which controls movement of the piston rod of the air cylinder.

11. The apparatus of claim 9, further comprising an aperture support member integral with the end of said piston rod, said aperture support member having an upwardly open semi-annular concavity in which said aperture is seated.

12. The apparatus of claim 1, further comprising;
   a sensor which senses whether said aperture is disposed at said second location;
   a control circuit which issues a signal responsible for setting the aperture at either of said first and second locations;
   an error detecting circuit operatively connected to said sensor and to said control circuit for determining whether an error has occurred in the positioning of said aperture; and
   an alarm operatively connected to said error detecting circuit so as to be triggered by said error detecting circuit when said error detecting circuit has detected an error.

13. The apparatus of claim 12, wherein said error detecting circuit comprises an exclusive logic-sum gate which logically sums signals issued by said control circuit and said sensor.

14. The apparatus of claim 1, wherein said moving means comprises a motor.

15. The apparatus of claim 14, further comprising a rod supporting said aperture and coupled to said motor, and a motor controller which controls the output of said motor.

16. The apparatus of claim 15, further comprising:
   a sensor which senses whether said aperture is disposed at said second location;
   a control circuit which issues a signal responsible for setting the aperture at either of said first and second locations;
   an error detecting circuit operatively connected to said sensor and to said control circuit for determining whether an error has occurred in the positioning of said aperture; and an alarm operatively connected to said error detecting circuit so as to be triggered by said error detecting circuit when said error detecting circuit has detected an error.

17. The apparatus of claim 16, wherein said error detecting circuit comprises an exclusive logic-sum gate which logically sums signals issued by said control circuit and said sensor.

18. The apparatus of claim 1, wherein said aperture comprises an aperture stop having an aperture capable of changing the diameter of the beam of light before the light impinges the surface supported on said leveling stage.

19. The apparatus of claim 18, wherein said aperture stop comprises a fixed member, an adjustable member supported by said fixed member so as to be movable relative thereto, and a plurality of elements which together define the size of said aperture, said elements being coupled to said adjustable member so as to change the size of the aperture as the adjustable member is moved relative to said fixed member.

20. The apparatus of claim 19, wherein said adjustable member is a rotary member supported for rotation by said fixed member, and said elements overlap each other in the form of a wing, said elements being folded about each other and unfolded as said rotary member is rotated in first and second opposite directions, respectively, the folding of said elements about each other increasing the size of said aperture and the unfolding of said elements decreasing the size of said aperture.

21. The apparatus of claim 20, wherein said fixed member has an outer surface on which a reference mark is formed, and said rotary member has a series of markings spaced from one another in the circumferential direction of the rotary member and each of which markings is alignable with the reference mark so as to indicate the size of the aperture being formed by the aperture stop.

22. The apparatus of claim 1, wherein said aperture comprises a set of aperture stops having apertures of different sizes which may be sequentially positioned in the second location, and further comprising an aperture stop support member capable of supporting any one of said aperture stops.

23. The apparatus of claim 1, wherein said aperture comprises a variable aperture stop having a fixed member including a reference mark thereon and a movable member having a reference mark thereon, one of the fixed member and the movable member having a plurality of reference marks, the reference marks being in the direction of the at least one dimension, such that, when aligned, respective reference marks indicate the size of the aperture being formed by the variable aperture stop.

24. The apparatus of claim 1, further comprising a size detector which measures a size of the exposure field on the surface and outputs a measured size.

25. The apparatus of claim 24, further comprising an aperture controller which automatically adjusts the at least one dimension said aperture based on the measured size of the exposure field.

26. The apparatus of claim 25, wherein said aperture comprises a variable aperture stop having a fixed member including a reference mark thereon and a movable member having a reference mark thereon, one of the fixed member and the movable member having a plurality of reference marks, the reference marks being in the direction of the at least one dimension, such that, when aligned, respective reference marks indicate the size of the aperture being formed by the variable aperture stop, and wherein the aperture controller verifies attainment of a desired size of the at least one dimension in accordance with the aligning of the reference marks.

* * * * *